United States Patent [19]
Goto et al.

[11] Patent Number: 5,832,015
[45] Date of Patent: Nov. 3, 1998

[54] LASER-DIODE-PUMPED SOLID-STATE LASER

[75] Inventors: Chiaki Goto; Kenji Matumoto, both of Kanagawa-ken, Japan

[73] Assignee: Fuji Photo Film Co., Ltd., Kanagawa-ken, Japan

[21] Appl. No.: 530,530

[22] Filed: Sep. 19, 1995

[30] Foreign Application Priority Data

Sep. 20, 1994 [JP] Japan .................................. 6-225068

[51] Int. Cl.$^6$ ........................................................ H01S 3/04
[52] U.S. Cl. ............................... 372/34; 372/36; 372/75
[58] Field of Search ........................ 372/34, 36; 359/196, 359/75

[56] References Cited

U.S. PATENT DOCUMENTS

| | | | |
|---|---|---|---|
| 5,181,214 | 1/1993 | Berger et al. | 372/34 |
| 5,303,250 | 4/1994 | Masuda et al. | 372/22 |
| 5,383,168 | 1/1995 | O'Brien et al. | 359/196 |
| 5,446,750 | 8/1995 | Ohtsuka et al. | 372/34 |

FOREIGN PATENT DOCUMENTS 5-235455  9/1993  Japan ............................. H01S 3/109

Primary Examiner—Leon Scott, Jr.
Attorney, Agent, or Firm—Sughrue, Mion, Zinn, Macpeak & Seas, PLLC

[57] ABSTRACT

A solid-state laser module made up of a solid-state laser crystal, a semiconductor laser for pumping purposes, and a resonator mounted on one surface of a mounting plate. A base plate is spaced apart from the mounting plate while facing the opposite side of the mounting plate to the module-mounted side. The base plate and the mounting plate are coupled together by means of at least one coupling member. A temperature control element for controlling the temperature of the solid-state laser module is interposed between the mounting plate and the base plate with elastic adhesive layers between the element and the mounting plate, and between the element and the base plate.

7 Claims, 3 Drawing Sheets

F I G . 1
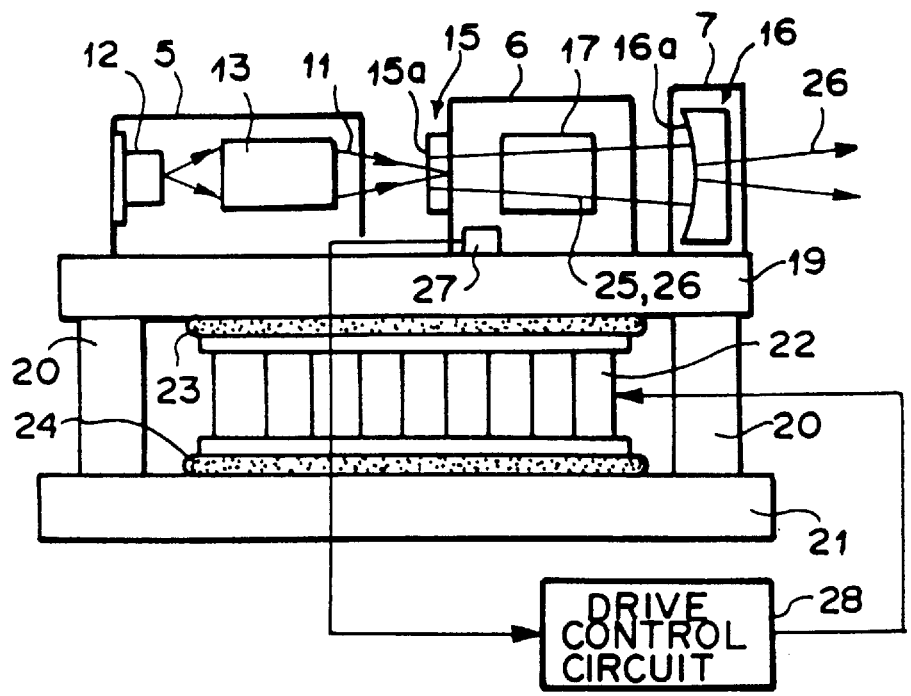
F I G . 2
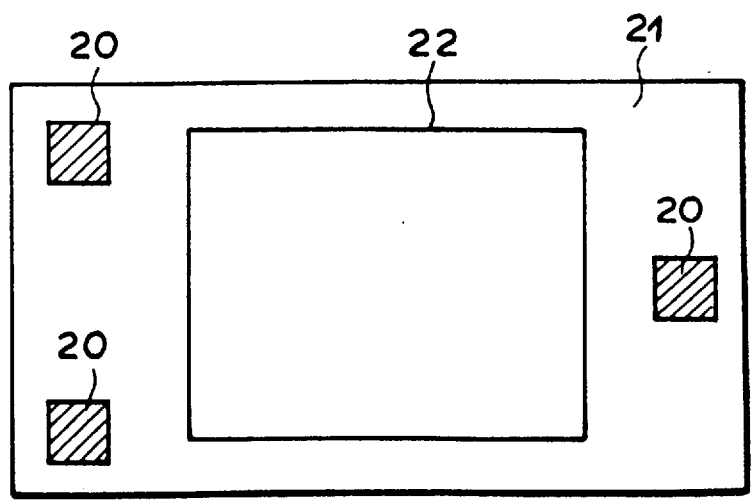

LASER-DIODE-PUMPED SOLID-STATE LASER

BACKGROUND OF THE INVENTION

1. Field of the Invention

This invention relates to a laser-diode-pumped solid-state laser in which a solid-state laser crystal is pumped with a semiconductor laser (a laser diode), and more particularly to a laser-diode-pumped solid-state laser having a temperature control element of improved impact resistance.

2. Description of the Prior Art

A laser-diode-pumped solid-state laser is well known, wherein a solid-state laser crystal, doped with rare earth elements such as Neodymium, is pumped with a semiconductor laser.

In the laser-diode-pumped solid-state laser of this type, it is common practice, as disclosed, for example, in Unexamined Japanese Patent Publn. No. Hei-5(1993)-235455, to mount a solid-state laser module, consisting of a semiconductor laser, a solid-state laser crystal, and a resonator, on a mounting plate and to control the temperature of a solid-state laser module to a predetermined level by use of a temperature control element such as a Peltier element joined to the mounting plate, in order to control an oscillation wavelength of the semiconductor laser and to afford stability to a solid-state laser resonator.

However, in the case of the conventional laser-diode-pumped solid-state laser having the temperature control function, the temperature control element such as a Peltier element of low mechanical strength is deteriorated or damaged when subjected to impact due to being dropped during transport or installation. In many cases, such deterioration of, or damage to, the temperature control element results in impaired cooling capability or total loss of temperature control.

SUMMARY OF THE INVENTION

The present invention is conceived in view of the foregoing drawbacks in the prior art, and the object of the present invention is to provide a laser-diode-pumped solid-state laser having a temperature control element of improved impact resistance.

According to one aspect of the present invention, the above object is achieved by a laser-diode-pumped solid-state laser having a solid-state laser module which is made of a solid-state laser crystal, a semiconductor laser for pumping purposes, and a resonator, and which is at least partially mounted on one surface of a mounting plate, the laser-diode-pumped solid-state laser comprising a base plate spaced apart from the mounting plate while facing an opposite surface of the mounting plate to the one surface; at least one heat-insulating coupling member for coupling the base plate and the mounting plate together; and a temperature control element sandwiched between the base plate and the mounting plate, with elastic adhesive layers between the base plate and the element, and between the element and the mounting plate.

Preferably, it is possible to use, preferably, glass or ceramics of high mechanical strength as a material for constituting the heat-insulating coupling member.

In another aspect of the present invention, it is preferable to use materials which set at room temperature for the formation of the elastic adhesive layer.

In still another aspect of the present invention, it is preferable to use highly heat-conductive materials, or adhesives of the silicon rubber family, the epoxy family, or the urethane family containing highly heat-conductive fillers such as alumina or boron nitride.

In a further aspect of the present invention, a slot should be made in the base plate and/or the mounting plate, extending from the end face thereof to a position between the temperature control element and the coupling member.

The reason why the temperature control element of the foregoing conventional laser-diode-pumped solid-state laser is prone to deterioration or damage is that the temperature control element is susceptible to direct impact forces when dropped without being housed, and that the impact forces are directly transmitted to the temperature control element through a housing even if it is dropped while being housed.

Contrary to this, in the laser-diode-pumped solid-state laser according to the present invention, the temperature control element undergoes less direct impact because it is sandwiched between the mounting plate and the base plate. Even if an impact force is applied to the coupling member or the base plate, the force applied to the temperature control element is attenuated by virtue of the absorbing action of the resilient adhesive layer, thereby resulting in a temperature control element having an improved impact resistance.

As a matter of fact, the mounting plate is attached to the temperature-control side of the temperature control element, whereas the base plate is attached to the heat-radiation side of the same. Hence, a temperature difference arises between the mounting plate and the base plate. However, since the mounting plate and the base plate are coupled together by the heat insulating coupling member, the temperature control effect of the temperature control element is prevented from being significantly impaired by the coupling member.

However, these two members which are different in temperature from each other are tightly coupled together by means of the coupling member. Thermal stresses (thermal strains) develop between the mounting plate and the base plate, and these thermal stresses may damage or deteriorate the temperature control element.

If the slot is made in the base plate, extending from the end face thereof to a position between the temperature control element and the coupling member, the previously mentioned thermal stresses will not travel to the temperature control element, thereby effectively preventing the deterioration of, and damage to, the temperature control element. The same effect is obtained even when similar slots are formed in the mounting plate or in both the base plate and the mounting plate.

If the elastic adhesive layer is produced by using the room-temperature-setting materials, it will become possible to prevent the temperature control element from being deteriorated and damaged as a result of the propagation of heat for curing the adhesive layer during the assembly of the laser to the temperature control element, and the fusing of solder for use in electrically connecting the temperature control element.

If the elastic adhesive layer is made of a highly heat conductive material, the conduction of heat between the mounting plate, the base plate, and the temperature control element becomes improved. The temperature control effect and the heat radiation effect of the solid-state laser module as a result of the temperature control element are appropriately maintained.

BRIEF DESCRIPTION OF THE DRAWINGS

FIG. 1 is a side elevation view showing a laser-diode-pumped solid-state laser according to a first embodiment of the present invention;

FIG. 2 is a partially broken plan view showing the principal elements of the laser-diode-pumped solid-state laser according to the first embodiment of the present invention;

DESCRIPTION OF THE PREFERRED EMBODIMENTS

Figure 3:
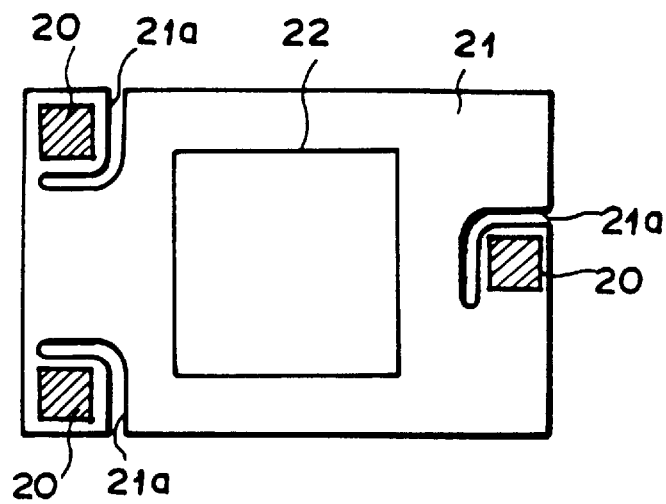
FIG. 3 is a partially broken plan view showing the principal elements of the laser-diode-pumped solid-state laser according to a second embodiment of the present invention.

With reference to the accompanying drawings, the preferred embodiments of the present invention will be described in detail.

FIG. 1 shows a laser-diode-pumped solid-state laser according to a first embodiment of the present invention. This laser-diode-pumped solid-state laser is made up of a semiconductor laser 12 for emanating a laser beam 11 as a pump beam, a distributed index rod lens 13 for collecting the laser beam 11 which is divergent light; an Nd:YVO$_4$ crystal 15 which is a solid-state laser crystal doped with Neodymium (Nd); a resonator mirror 16 disposed in front of the Nd:YVO$_4$ 15 (on the right side in the drawing); and a solid-state laser module made of a KTP crystal 17 which serves as a wavelength-converter element and is interposed between the resonator mirror 16 and the Nd:YVO$_4$ crystal 15.

The semiconductor laser 12 and the distributed index rod lens 13 are held in a holder 5, and the Nd:YVO$_4$ crystal 15 and the KTP crystal 17 are held in a holder 6. A holder 7 holds the resonator mirror 16. These holders 5, 6 and 7 are made of, for example, copper having a high heat conducting property, and they are mounted on the upper surface of a mounting plate 19. This mounting plate 19 is also made of, for example, highly heat conductive copper.

One end of each of three coupling members 20 made of highly heat insulating ceramics is fixed to the lower surface of the mounting plate 19. The other ends of the coupling members 20 are fixed to a base plate 21 made of, for example, highly heat conductive copper. A Peltier element 22 is interposed as a temperature control element between the mounting plate 19 and the base plate 21. FIG. 2 shows the three coupling members 20 and the Peltier element 22 disposed on the base plate 21, as viewed from above.

A temperature-control side (the upper side in the drawing) of the Peltier element 22 and a heat radiation side (the lower side in the drawing) of the same are adhered to the mounting plate 19 and the base plate 21 with an elastic adhesive layer 23 and an elastic adhesive layer 24 respectively sandwiched between them. These elastic adhesive layers 23 and 24 can be made by appropriately selecting the previously mentioned materials. Particularly, in this embodiment, the elastic adhesive layers are made of silicon rubber-based adhesives of highly heat conductive and room-temperature setting which include alumina fillers.

A temperature sensor 27 for sensing the inside temperature of the resonator is disposed between the Nd:YVO$_4$ crystal 15, which forms one resonator mirror, and the resonator mirror 16, in a manner as will be described later. The actuation of the Peltier element 22 is controlled by a drive control circuit 28 which receives an output from the temperature sensor 27.

A semiconductor laser which emanates the laser beam 11 having a wavelength of $\lambda_1$=809 nm is used as the semiconductor laser 12. The Nd:YVO$_4$ crystal 15 emanates a laser beam 25 having a wavelength of $\lambda_2$=1064 nm as a result of the excitation of Neodymium ions by the laser beam 11.

An entrance surface 15a of the Nd:YVO$_4$ crystal 15 is covered with a coating which appropriately reflects the laser beam 25 having a wavelength of 1064 nm (a reflectivity of more than 99.9%) but allows the pumping laser beam 11 having a wavelength of 809 nm to pass through (a transmissivity of more than 99%). On the other hand, an inner surface 16a of the resonator mirror 16 is concavely formed, and the inner surface 16a is covered with a coating which appropriately reflects the laser beam 25 having a wavelength of 1064 nm but allows a second harmonic wave 26 having a wavelength of 532 nm which will be described later to pass through.

By virtue of this configuration, the laser beam 25 having a wavelength of 1064 nm to be confined between the surfaces 15a and 16a, thereby bringing about laser oscillation. The laser beam 25 enters the KTP crystal 17 and is subjected to wavelength conversion in the same, whereby a second harmonic wave 26 having a wavelength of $\lambda_3$=532 nm is emitted from the KTP crystal 17. Both ends of the KTP crystal 17 are covered with coatings which allow the laser beam 25 and the second harmonic wave 26 to appropriately pass through.

The drive control circuit 28 actuates the Peltier element 22 in such a way that the internal temperature of the resonator sensed by the temperature sensor 27 becomes constant. The control of the temperature of the resonator prevents variations in the length of the resonator due to temperature changes. The temperature of the semiconductor laser 12 disposed adjacent to the resonator is also held at a constant level, whereby a longitudinal mode is constantly maintained.

In such a laser-diode-pumped solid-state laser, the Peltier element 22 is disposed between the mounting plate 19 and the base plate 21, and hence the Peltier element 22 undergoes less direct impact even if the laser system is dropped. Further, if an impactive force is applied to the mounting plate 19, the coupling members 20, or the base plate 21, the buffering action of the elastic adhesive layers 23 and 24 attenuates the force applied to the Peltier element 22, whereby the impact resistance property of the Peltier element 22 is improved.

A drop test was carried out to examine the impact resistance of the Peltier element 22 with respect to the conventional laser-diode-pumped solid-state laser, in which the Peltier element 22 is mounted on the mounting plate 19 and the Peltier element 22 is directly fixed within a housing, and the laser-diode-pumped solid-state laser of the present invention.

When the conventional laser was dropped three times from a height of 50 mm, the internal resistance of the Peltier element 22 increased by about 5%. When the conventional laser was dropped three times from a height of 100 mm, the internal resistance of the Peltier element 22 became ∞ (broken). Contrary to this, when the laser-diode-pumped solid-state laser of the present invention was dropped from a height of 50 mm three times, was no increase in the internal resistance of the Peltier element 22. Even when the laser of the present invention was dropped three times from a height of 100 mm, the Peltier element 22 remained unbroken, and the increase of the internal resistance was limited to 10%.

Furthermore, since the elastic adhesive layers 23 and 24 are made of highly heat conductive materials in this embodiment, superior thermal conduction is obtained between the mounting plate 19, the base plate 21, and the Peltier element 22. As a result of this, the temperature control effect and the heat radiation effect, via the base plate 21, of the solid-state laser module are appropriately maintained by virtue of the Peltier element 22. The elastic adhesive layers 23 and 24 are made of room-temperature-setting materials, and hence, in contrast with an elastic adhesive layer made of thermosetting adhesives, it is possible to prevent the deterioration of, and damage to, the Peltier element 22 resulting from the propagation of heat for setting the adhesives to the Peltier element 22 and the fusing of solder used for electrically connecting the Peltier element 22.

With reference to FIGS. 3 through 6, other embodiments of the present invention will now be described. The embodiments as described later are principally the same as the first embodiment, except for the shape of the base plate 21 and the arrangement of the coupling members 20 and the Peltier element 22.

In a second embodiment shown in FIG. 3, three slots 21a are formed in the base plate 21 extending from the end face thereof to a position between the Peltier element 22 and each of the coupling members 20.

The temperature of the base plate 21 is substantially the same as ambient temperature, for example, in the range from 10° to 50° C. The mounting plate 19 is substantially maintained at a controlled temperature, for example, a temperature of 15° C. The two members, which are significantly different from each other in temperature, are tightly combined together, and therefore thermal stress develops between the mounting plate 19 and the base plate 21. Upon being subjected to this thermal stress, the Peltier element 22 may be deteriorated or damaged.

However, if the previously mentioned three slots 21a are formed in the base plate, the thermal stress will not travel to the Peltier element 22, which effectively prevents the Peltier element 22 from being deteriorated and damaged. Such an effect is also obtained even when similar slots are made in the mounting plate 19 or in both the base plate 21 and the mounting plate 19.

Figure 4:
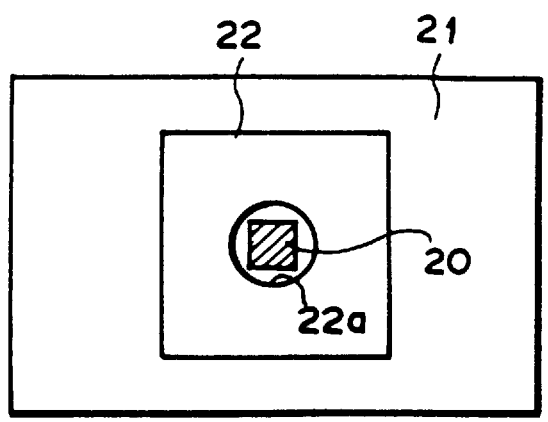
FIG. 4 is a partially broken plan view showing the principal elements of the laser-diode-pumped solid-state laser according to a third embodiment of the present invention.

In a laser-diode-pumped solid-state laser according to a third embodiment as shown in FIG. 4, a Peltier element with a hole therein is used as the Peltier element 22. The mounting plate 19 (not shown) and the base plate 21 are coupled together by one coupling member 20 provided in a hole 22a formed at the center of the Peltier element 22.

Figure 5:
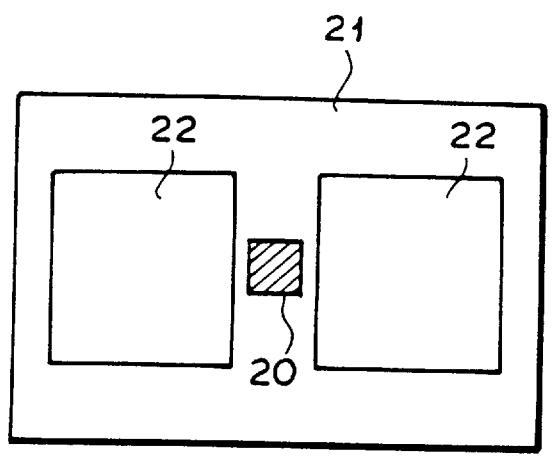
FIG. 5 is a partially broken plan view showing the principal elements of the laser-diode-pumped solid-state laser according to a fourth embodiment of the present invention.

In a laser-diode-pumped solid-state laser according to a fourth embodiment as shown in FIG. 5, two Peltier elements 22 are used. One coupling member 20 is interposed between these Peltier elements 22, and the mounting plate 19 (not shown) and the base plate 21 are coupled together by this coupling member 20.

Figure 6:
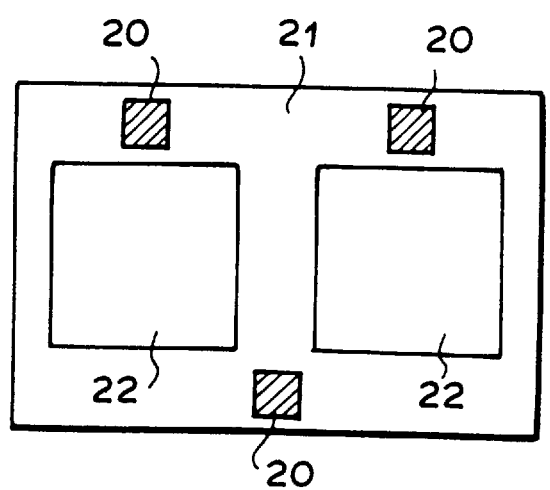
FIG. 6 is a partially broken plan view showing the principal elements of the laser-diode-pumped solid-state laser according to a fifth embodiment of the present invention.

In a laser-diode-pumped solid-state laser according to a fifth embodiment as shown in FIG. 6, two Peltier elements 22 are used. A total of three coupling members 20 are disposed outside the Peltier elements 22, and the mounting plate 19 (not shown) and the base plate 21 are coupled together by these coupling members 20.

In the above embodiments, the Nd:YVO$_4$ crystal 15 is used as the solid-state laser crystal, and the KTP crystal 17 is used as a wavelength-converting element in the above embodiments. However, as a matter of course, the present invention is similarly applicable to laser-diode-pumped solid-state lasers which employ a solid-state laser crystal or a wavelength-converter element other than the previously mentioned lasers.

Furthermore, the present invention is applicable to laser-diode-pumped solid-state lasers which does not use wavelength conversion, laser-diode-pumped solid-state lasers which obtain a sum frequency by employing a solid-state laser oscillated beam as one fundamental wave, and laser-diode-pumped solid-state lasers designed so as to generate a third harmonic wave of the oscillated beam, as well as to the laser-diode-pumped solid-state laser in which a solid-state laser oscillated beam is converted to a second harmonic wave through wavelength conversion.

Several embodiments of the invention have now been described in detail. It is to be noted, however, that these descriptions of specific embodiments are merely illustrative of the principles underlying the inventive concept. It is contemplated that various modifications of the disclosed embodiments, as well as other embodiments of the invention will, without departing from the spirit and scope of the invention, be apparent to those who are skilled in the art.

What is claimed is:

1. A laser-diode-pumped solid-state laser, comprising:
   a mounting plate having a first surface on which is disposed a plurality of components, including a solid state element, pumped to produce a laser beam;
   a base plate spaced apart from the mounting plate while facing a surface which is opposite to the first surface of the mounting plate;
   at least one heat-insulating coupling member extending from the base plate to the mounting plate;
   a temperature control element disposed between the base plate and the mounting plate;
   a first elastic adhesive layer disposed between the base plate and the temperature control element; and
   a second elastic adhesive layer disposed between the mounting plate and the temperature control element;
   whereby said first and second elastic adhesive layers attenuate force applied to the temperature control element by absorbing the force.

2. The laser device as defined in claim 1, wherein the elastic adhesive layer is made of materials which set at room temperature.

3. The laser device as defined in claim 2, wherein the elastic adhesive layer is made of highly heat conductive materials.

4. The laser device as defined in claim 2, wherein a slot is made in the base plate and/or the mounting plate, extending from the end face thereof to a position between the temperature control element and the coupling member.

5. The laser device as defined in claim 1, wherein the elastic adhesive layer is made of highly heat conductive materials.

6. The laser device as defined in claim 5, wherein a slot is made in the base plate and/or the mounting plate, extending from the end face thereof to a position between the temperature control element and the coupling member.

7. The laser device as defined in claim 1, wherein a slot is made in the base plate and/or the mounting plate, extending from the end face thereof to a position between the temperature control element and the coupling member.

* * * * *